(12) United States Patent
Jiang et al.

(10) Patent No.: US 8,354,704 B2
(45) Date of Patent: Jan. 15, 2013

(54) METHOD FOR FABRICATING AN ENLARGED OXIDE-NITRIDE-OXIDE STRUCTURE FOR NAND FLASH MEMORY SEMICONDUCTOR DEVICES

(75) Inventors: Li Jiang, Shanghai (CN); Hong Xiu Peng, Shanghai (CN); Jong Woo Kim, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 52 days.

(21) Appl. No.: 12/917,419

(22) Filed: Nov. 1, 2010

(65) Prior Publication Data

US 2011/0115012 A1    May 19, 2011

(30) Foreign Application Priority Data

Nov. 10, 2009   (CN) .......................... 2009 1 0198585

(51) Int. Cl.
*H01L 29/76* (2006.01)
(52) U.S. Cl. ........ 257/314; 257/315; 257/324; 257/411; 257/E27.078
(58) Field of Classification Search .................. 257/314, 257/315, 324, 411
See application file for complete search history.

(56) References Cited

U.S. PATENT DOCUMENTS

| 2006/0043458 A1* | 3/2006 | Rudeck | 257/315 |
| 2006/0205151 A1* | 9/2006 | Lee | 438/257 |
| 2009/0166713 A1* | 7/2009 | Kim | 257/324 |

FOREIGN PATENT DOCUMENTS

CN        1770429 A        10/2006

* cited by examiner

*Primary Examiner* — Wai Sing Louie
(74) *Attorney, Agent, or Firm* — Kilpatrick Townsend & Stockton LLP

(57) ABSTRACT

A method of processing a flash memory device provides a semiconductor substrate including a surface region and forming a gate dielectric layer overlying the surface region. The method forms a floating gate layer having a thickness and including a first floating gate structure overlying a first portion of the gate dielectric layer and a second floating gate structure overlying a second portion of the gate dielectric layer. The method forms a trench region interposed between the first and second floating gate structures and extending through the entire thickness and through a portion of the surface region into a depth of the substrate. The method fills the entire depth of the trench region in the substrate and a portion of the trench region over the substrate using a dielectric fill material. The method forms an oxide on nitride on oxide (ONO) layer overlying the first and second floating gate structures and the dielectric material and a control gate overlying the ONO layer.

9 Claims, 16 Drawing Sheets

C-C' cross-sectional view

Cross-sectional view along A-A' of Fig. 8A

Cross-sectional view A1-A1' of Figure 8A

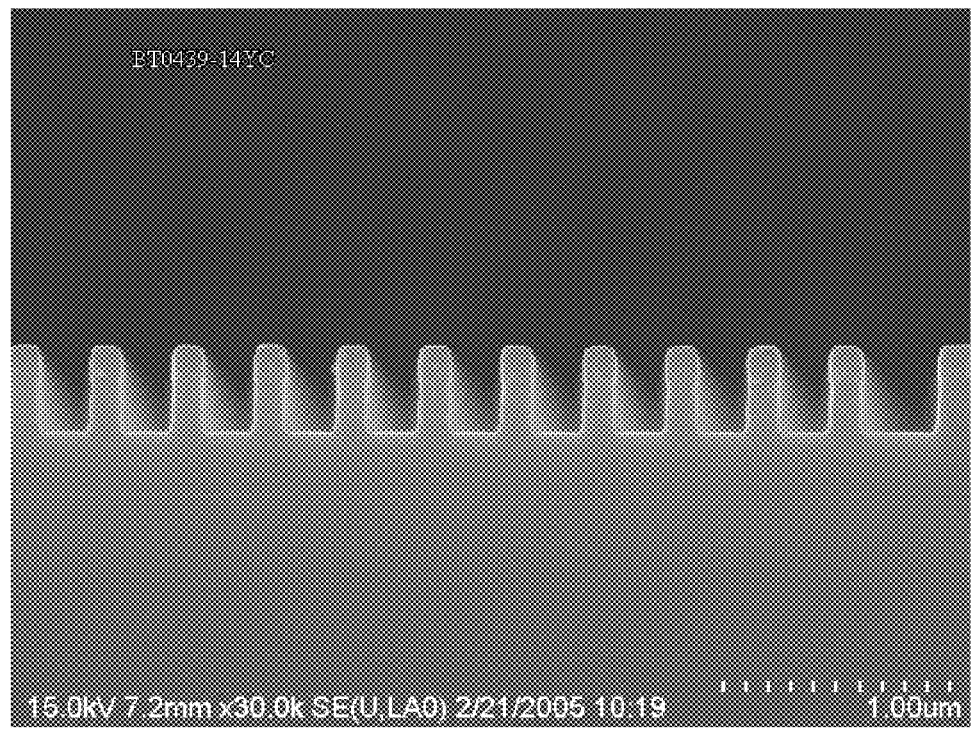
Cross-sectional view B-B' of Figure 8A  Figure 8D
Height
1= 0.0397um
2= 0.0741um
Width
3= 0.1349um
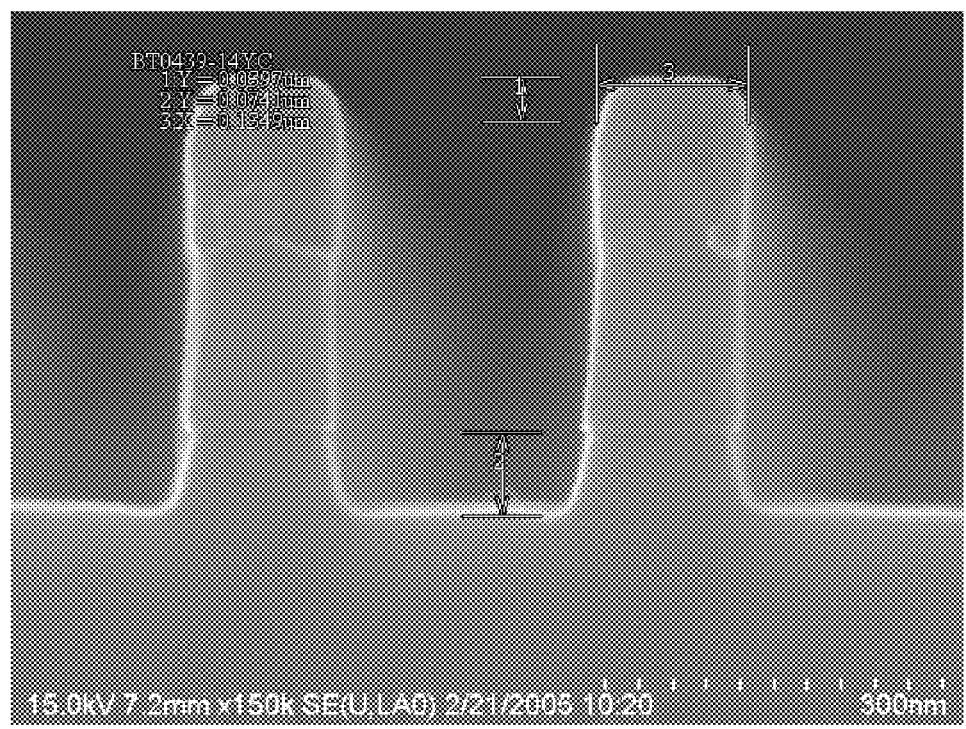
Enlarged view of Figure 8D  Figure 8E

METHOD FOR FABRICATING AN ENLARGED OXIDE-NITRIDE-OXIDE STRUCTURE FOR NAND FLASH MEMORY SEMICONDUCTOR DEVICES

CROSS-REFERENCES TO RELATED APPLICATIONS

This application claims priority to Chinese Application No. 200910198585.1, filed Nov. 10, 2009, commonly assigned, and incorporated herein by reference for all purposes.

BACKGROUND OF THE INVENTION

Embodiments of the present invention are directed to integrated circuits and their processing for the manufacture of semiconductor devices. More particularly, embodiments of the invention provide a method and structure for manufacturing oxide on nitride on oxide structures, commonly called "ONO," for memory devices. Merely by way of example, embodiments of the present invention have been applied to the manufacture of Flash memory devices. But it would be recognized that embodiments of the present invention have a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of ONO structures for Flash Memory devices. Such Flash Memory device has traditionally became smaller and smaller and produced faster switching speeds. Although there have been significant improvements, such device designs still have many limitations. As merely an example, these designs must become smaller and smaller but still provide clear signals for switching, which become more difficult as the device becomes smaller. Additionally, these designs are often difficult to manufacture and generally require complex manufacturing processes and structures. These and other limitations will be described in further detail throughout the present specification and more particularly below.

From the above, it is seen that an improved technique for processing semiconductor devices is desired.

BRIEF SUMMARY OF THE INVENTION

According to embodiments of the present invention, techniques for processing integrated circuits for the manufacture of semiconductor devices are provided. More particularly, embodiments of the invention provide a method and structure for manufacturing oxide on nitride on oxide structures, commonly called "ONO," for memory devices. Merely by way of example, embodiments of the invention have been applied to the manufacture of Flash memory devices. But it would be recognized that the invention has a much broader range of applicability.

In a specific embodiment, the present invention provides a flash memory device structure, e.g., NAND Flash. The structure has a semiconductor substrate including a surface region. In a specific embodiment, the semiconductor substrate can be a silicon wafer, an epitaxial wafer, a silicon on insulator wafer, or others. The structure has a gate dielectric layer (e.g., silicon dioxide, silicon oxynitride, silicon nitride) overlying the surface region. The structure has a floating gate layer having a floating gate layer thickness and including a first floating gate structure overlying a first portion of the gate dielectric layer and a second floating gate structure overlying a second portion of the gate dielectric layer. In a preferred embodiment, the first floating gate structure is separated and distinct from the second floating gate structure. The structure has a trench region provided between the first floating gate structure and the second floating gate structure and extending through an entirety of the floating gate layer thickness, which separates the two floating gate structures from each other. The trench region extends through a portion of the surface region into a depth of the semiconductor substrate. The structure also has a dielectric material (e.g., high density plasma oxide) filling an entirety of the depth of the trench region in the semiconductor substrate and filling a portion of the trench region between the first floating gate structure and the second floating gate structure. The structure has an oxide on nitride on oxide layer overlying the first floating gate structure, the dielectric material, and the second floating gate structure. The flash memory device structure also has a control gate overlying the oxide on nitride on oxide layer.

In an alternative specific embodiment, the present invention provides a method for processing a flash memory device structure, e.g., NAND Flash. The method includes providing a semiconductor substrate including a surface region. The method also includes forming a gate dielectric layer overlying the surface region. The method also forms a floating gate layer having a floating gate layer thickness and including a first floating gate structure overlying a first portion of the gate dielectric layer and a second floating gate structure overlying a second portion of the gate dielectric layer. The method forms a trench region provided between the first floating gate structure and the second floating gate structure and extending through an entirety of the floating gate layer thickness. In a preferred embodiment, the trench region extends through a portion of the surface region into a depth of the semiconductor substrate. The method includes filling an entirety of the depth of the trench region using a dielectric fill material in the semiconductor substrate and filling an entirety of the trench region between the first floating gate structure and the second floating gate structure using the dielectric fill material. In a specific embodiment, the method includes performing a planarization process on the dielectric fill material. The method selectively removes (e.g., HF dip) a portion of the dielectric fill material between the first floating gate structure and the second floating gate structure to form a recessed region between the first floating gate structure and the second floating gate structure. The method forms an oxide on nitride on oxide layer overlying the first floating gate structure, the recessed region including the dielectric material, and the second floating gate structure. The method also forms a control gate overlying the oxide on nitride on oxide layer.

In yet an alternative specific embodiment, the present invention provides a method for processing a flash memory device structure, e.g., NAND Flash. The method includes providing a semiconductor substrate including a surface region. The method also includes forming a gate dielectric layer overlying the surface region. The method also forms a floating gate layer having a floating gate layer thickness and including a first floating gate structure overlying a first portion of the gate dielectric layer and a second floating gate structure overlying a second portion of the gate dielectric layer. The method forms a trench region provided between the first floating gate structure and the second floating gate structure and extending through an entirety of the floating gate layer thickness. In a preferred embodiment, the trench region extends through a portion of the surface region into a depth of the semiconductor substrate. The method includes filling an entirety of the depth of the trench region using a dielectric fill material in the semiconductor substrate and filling a portion of the trench region between the first floating gate structure and the second floating gate structure using the dielectric fill material. The method forms an oxide on nitride on oxide layer overlying the first floating gate structure, the dielectric material, and the second floating gate structure. The method also forms a control gate overlying the oxide on nitride on oxide layer.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 90 nanometers and less for high density Flash devices. In a preferred embodiment, the present method and structure provides an improved Flash device with higher program/erase speed using, for example, a HF dipping step after a self-aligned STI-CMP step. In a preferred embodiment, the present method and structure provide higher contact area (for example 100% more) between the ONO and floating gate structure, which causes a higher control gate-floating gate coupling ratio, higher program/erase speeds and other desirable properties. Depending upon the embodiment, the method and structure provides a higher ONO and polysilicon-1 contact area (e.g. greater than 100%) by adding a HF dipping step after STI-CMP, to cause a higher control gate-floating gate coupling ratio, a higher program/erase speed, among other desirable properties. In a specific embodiment, after a self-aligned STI-CMP process, a HF dipping step is added before silicon nitride removal to remove a portion (e.g., about 1000 Angstroms) of high density plasma (HDP) oxide in trench. After removal of silicon nitride (e.g., about 2000 Angstroms), a higher ONO and polysilicon 1 contact area (>100% higher) is achieved causing an increase in control gate-floating gate coupling ratio and a higher program/erase speed. Depending upon the embodiment, one or more of these benefits may be achieved. These and other benefits will be described in more throughout the present specification and more particularly below.

Various additional embodiments, features and advantages of the present invention can be more fully appreciated with reference to the detailed description and accompanying drawings that follow.

BRIEF DESCRIPTION OF THE DRAWINGS

FIGS. 8A, 8B, 8C, 8D and 8E are simplified top-view and cross-sectional view diagrams of a Flash memory device according to an embodiment of the present invention;

DETAILED DESCRIPTION OF THE INVENTION

According to the present invention, techniques for processing integrated circuits for the manufacture of semiconductor devices are provided. More particularly, the invention provides a method and structure for manufacturing oxide on nitride on oxide structures, commonly called "ONO," for memory devices. Merely by way of example, the invention has been applied to the manufacture of Flash memory devices. But it would be recognized that the invention has a much broader range of applicability.

Figure 1:
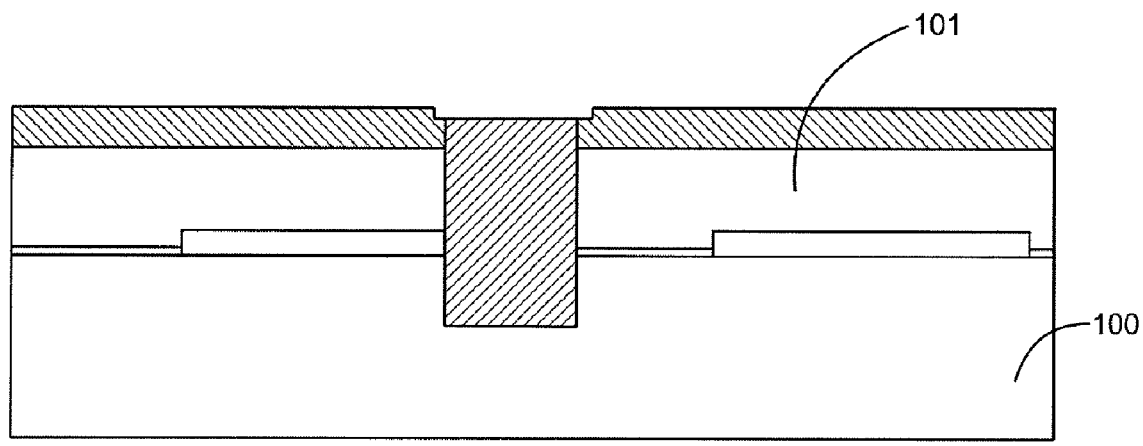
FIGS. 1 through 3 are simplified diagrams of a conventional method for fabricating a Flash memory device.
Figure 2:
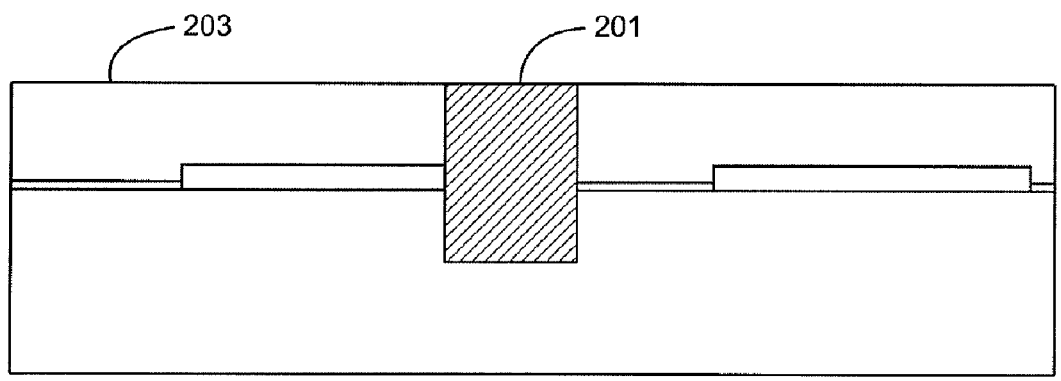
Figure 3:
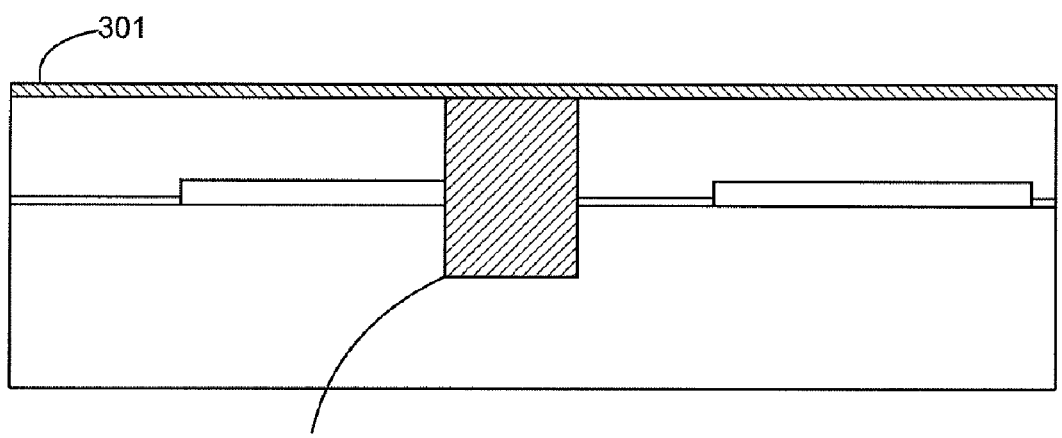

Referring to FIGS. 1 through 3, a conventional method for fabricating a NAND Flash Memory Device can be outlined below.

Step 1: Form low voltage (LV) oxide and high voltage (HV) oxide on a semiconductor substrate 100 (e.g., LV oxide thickness ranges from 80 Angstroms to 120 Angstroms and HV oxide thickness ranges from 300 Angstroms to 600 Angstroms);

Step 2: Form floating gate (FG) polysilicon using a deposition process, e.g., polysilicon thickness of about 800 Angstroms to about 2500 Angstroms;

Step 3: Deposit silicon nitride (SIN) using a deposition process, e.g., SiN thickness of about 800 Angstroms to about 1500 Angstroms;

Step 4: Perform active area (AA) photomasking process;

Step 5: Perform AA etch through openings in the photomask from the photomasking process;

Step 6: Perform AA etch asher and wet strip;

Step 7: Perform liner oxide deposition and high density plasma (HDP) oxide 201 deposition, e.g., HDP oxide thickness ranging from about 5000 Angstroms to about 8000 Angstroms;

Step 8: Perform ion implantation process (IMP);
Step 9: Perform antireflective layer (AR) photomasking process;
Step 10: Perform AR etch;
Step 11: Perform AR etch asher and wet strip;
Step 12: Perform planarization 203 using reversed STI-CMP;
Step 13: Perform SIN wet strip;
Step 14: Perform ONO 301 deposition.

As shown, the above steps illustrate a conventional method for fabricating a portion of a NAND Flash device. As shown, portion 301 of ONO layer, which is planar, overlies floating gate and the HDP oxide. As device sizes become smaller, the total area of the ONO layer of the floating gate becomes more limited. These and other limitations of the conventional method can be found throughout the present specification.

A method of fabricating a Flash memory according to an embodiment of the present invention can be outlines briefly as follows:
Step 1: Form low voltage (LV) oxide and high voltage (HV) oxide (e.g., LV oxide thickness of about 80 Angstroms to about 120 Angstroms, HV oxide thickness of about 300 Angstroms to about 600 Angstroms) (here the term "HV" oxide thickness refers to the thicker portion of oxide underlying a floating gate layer and does not correspond to a high voltage device according to a specific embodiment);
Step 2: Form floating gate (FG) 101 polysilicon using a deposition process, e.g., polysilicon thickness of about 800 Angstroms to about 2500 Angstroms;
Step 3: Deposit silicon nitride (SiN) using a deposition process, e.g., SIN thickness of about 800 Angstroms to about 1500 Angstroms;
Step 4: Perform active area (AA) photomasking process;
Step 5: Perform AA etch through openings in the photomask from the photomasking process;
Step 6: Perform AA etch ashing and wet strip;
Step 7: Perform liner oxide deposition and high density plasma (HDP) oxide deposition, e.g., HDP oxide thickness of about 5000 Angstroms to about 8000 Angstroms;
Step 8: Perform ion implantation process (IMP);
Step 9: Perform antireflective layer (AR) photomasking process;
Step 10: Perform AR etch;
Step 11: Perform AR etch ashing and wet strip;
Step 12: Perform planarization using reversed STI-CMP;
Step 13: Perform AFM in-line measurement of cell area for HDP oxide dishing, e.g., cell HDP oxide dishing: 100 Å-300 Å;
Step 14: Perform HF dipping, e.g., an HF dipping in a low concentration buffered HF for a predetermined time; HDP oxide removed: 500 Å-2000 Å;
Step 15: Perform SIN wet strip;
Step 16: Perform AFM in-line measurement on cell area HDP oxide dishing, e.g., cell HDP oxide dishing: 600 Å-2000 Å;
Step 17: Perform ONO deposition;
Step 18: Perform control gate layer deposition;
Step 19: Perform other steps, as desired.

The above sequence of steps provides a method according to an embodiment of the present invention. As shown, the process provides steps for forming a flash memory device structure using a method of forming an improved ONO structure between a floating gate and a control gate of a flash memory device according to a specific embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

Figure 4:
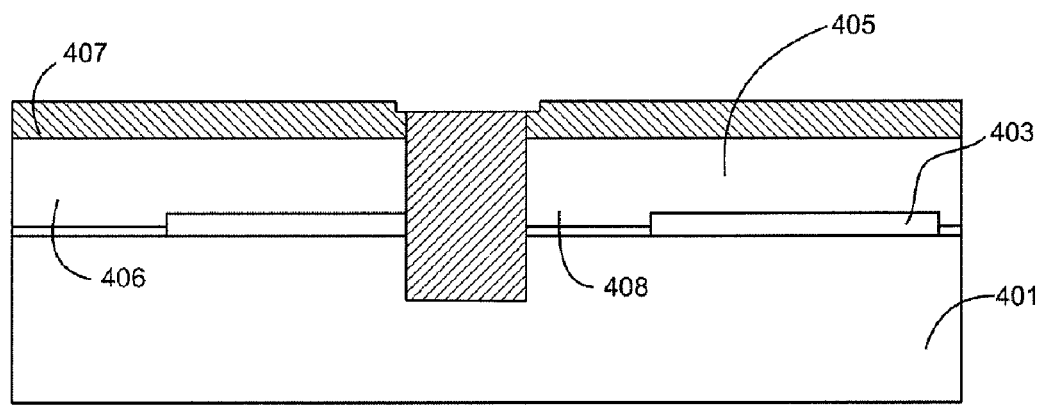
FIGS. 4 through 7 are simplified diagrams of a method for fabricating a Flash memory device according to an embodiment of the present invention.

FIGS. 4 through 7 are simplified diagrams of a method for fabricating a Flash memory device according to an embodiment of the present invention. These diagrams are merely examples, which should not unduly limit the scope of the claims herein. One of ordinary skill in the art would recognize many variations, modifications, and alternatives. As shown in FIG. 4, the present method begins by providing a semiconductor substrate 401. The semiconductor can be a silicon wafer, an epitaxial wafer, a silicon on insulator wafer, and others. As shown, the semiconductor substrate includes a surface region. The method includes forming a gate dielectric layer 403 overlying the surface region. The gate dielectric layer can be formed using thermal oxidation processes to form silicon dioxide, silicon nitride, silicon oxynitride, and other insulating materials. As merely an example, the method forms a low voltage (LV) oxide and a high voltage (HV) oxide. The LV oxide has a thickness ranging from 80 Angstroms to 120 Angstroms. The HV oxide has a thickness ranging from 300 Angstroms to about 600 Angstroms. The low voltage oxide can correspond to flash devices in the cell region and the high voltage thickness can correspond to high voltage devices, which are used for programming the flash devices. Of course, there can be various alternatives, modifications, and variations.

In a specific embodiment, the method includes forming a floating gate layer 405 having a floating gate layer thickness. In a specific embodiment, the floating gate layer has a first floating gate structure 406 overlying a first portion of the gate dielectric layer and a second floating gate structure 408 overlying a second portion of the gate dielectric layer. In a specific embodiment, the floating gate layer is formed by depositing a polysilicon layer and in-situ doped using phosphorus bearing species. Alternatively, the polysilicon layer can be formed in an amorphous state, which is later crystallized. Diffusion processes can also be used, depending upon the specific embodiment. As merely an example, the method forms a floating gate (FG) polysilicon at a thickness of about 800 Angstroms to about 2500 Angstroms using a deposition process. Of course, there can be other variations, modifications, and alternatives.

In a specific embodiment, the present method forms a trench region provided between the first floating gate structure and the second floating gate structure. In a specific embodiment, the trench region extends through an entirety of the floating gate layer thickness. The trench region extends through a portion of the surface region into a depth of the semiconductor substrate. As shown, the method forms a hard mask layer 407 overlying the floating gate layer in a specific embodiment. The method patterns the hard mask using a photomasking layer according to a specific embodiment.

Referring to FIG. 4, the method includes filling an entirety of the depth of the trench region using a dielectric fill material in the semiconductor substrate. In a specific embodiment, the method includes forming a liner oxide deposition to cover the trench structure. In a specific embodiment, the method uses a fill material such as a high density plasma (HDP) oxide. As merely an example, the HDP oxide thickness ranges from 5000 Angstroms to 8000 Angstroms. Alternatively, the fill material can be silicon oxide, silicon nitride, or other suitable materials. Of course, there can be other variations, modifications, and alternatives.

In a specific embodiment, the method performs a planarization process on an exposed portion of the fill material. In a preferred embodiment, the method performs a reverse tone etchback and a shallow trench isolation chemical mechanical polishing process. Of course, there can be other variations, modifications, and alternatives.

Figure 5:
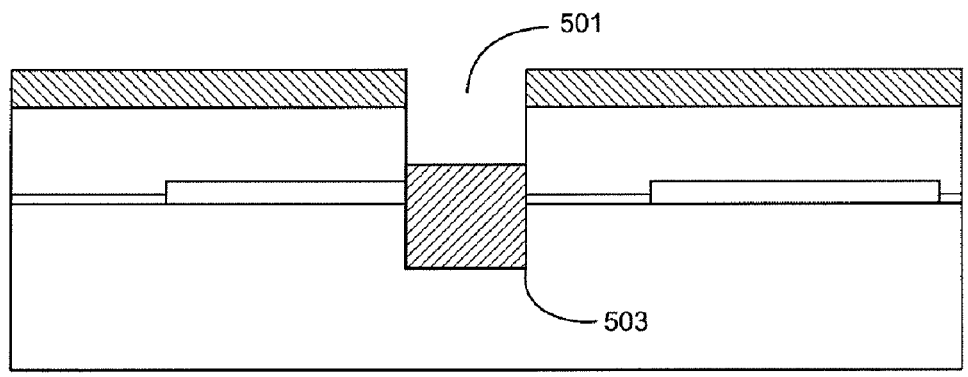

Referring now to FIG. 5, the method includes performing a selective etch to remove a thickness 501 of the fill material. The selective etch can be a plasma etch and/or a wet etch. As merely an example, a hydrofluoric acid (HF) dip using a low concentration buffered HF can be used. In a specific embodiment, a thickness of filled material ranging from about 500 Angstroms to about 2000 Angstroms is removed. Of course, there can be other variations, modifications, and alternatives.

Figure 6:
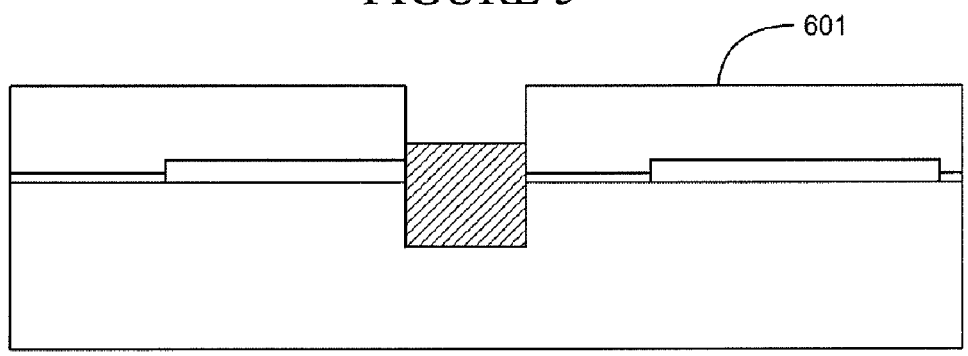

In a specific embodiment, the present method removes the hard mask layer as illustrated in FIG. 6. The hard mask layer can be a silicon nitride (SiN) layer or other suitable material, which can be selectively removed according to a specific embodiment. In a preferred embodiment, the method performs a SiN wet strip process using a phosphorus acid species. Of course, there can be various modifications and/or alternatives.

Figure 7:
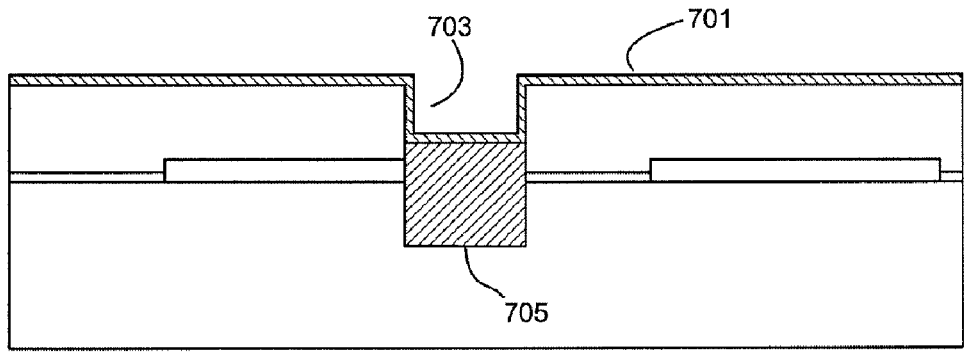

Referring to FIG. 7, the method forms a dielectric layer overlying the surface regions of the resulting substrate. In a specific embodiment, the method forms an oxide on nitride on oxide layer 701 overlying the first floating gate structure, the fill material 705, and the second floating gate structure. As shown, the dielectric material is recessed 703 from an upper portion of the floating gate layer to a depth within a thickness of the floating gate layer. In a specific embodiment, the depth ranges from 800 Armstrong to 1500 Armstrong but can be others.

To complete the device, the method forms a polysilicon layer overlying the oxide on nitride on oxide layer. The polysilicon layer is patterned to form control gate structures. The method also includes forming an upper metal layer structure, which will be used as interconnects, and an overlying passivation layer. Of course, there can be other variations, modifications, and alternatives.

The above sequence of steps is a method according to an embodiment of the present invention. As shown, the method provides a method for forming a flash memory device structure using a method for forming an improved ONO structure between a floating gate and a control gate of a flash memory device according to a specific embodiment of the present invention. Other alternatives can also be provided where steps are added, one or more steps are removed, or one or more steps are provided in a different sequence without departing from the scope of the claims herein.

Figure 8:
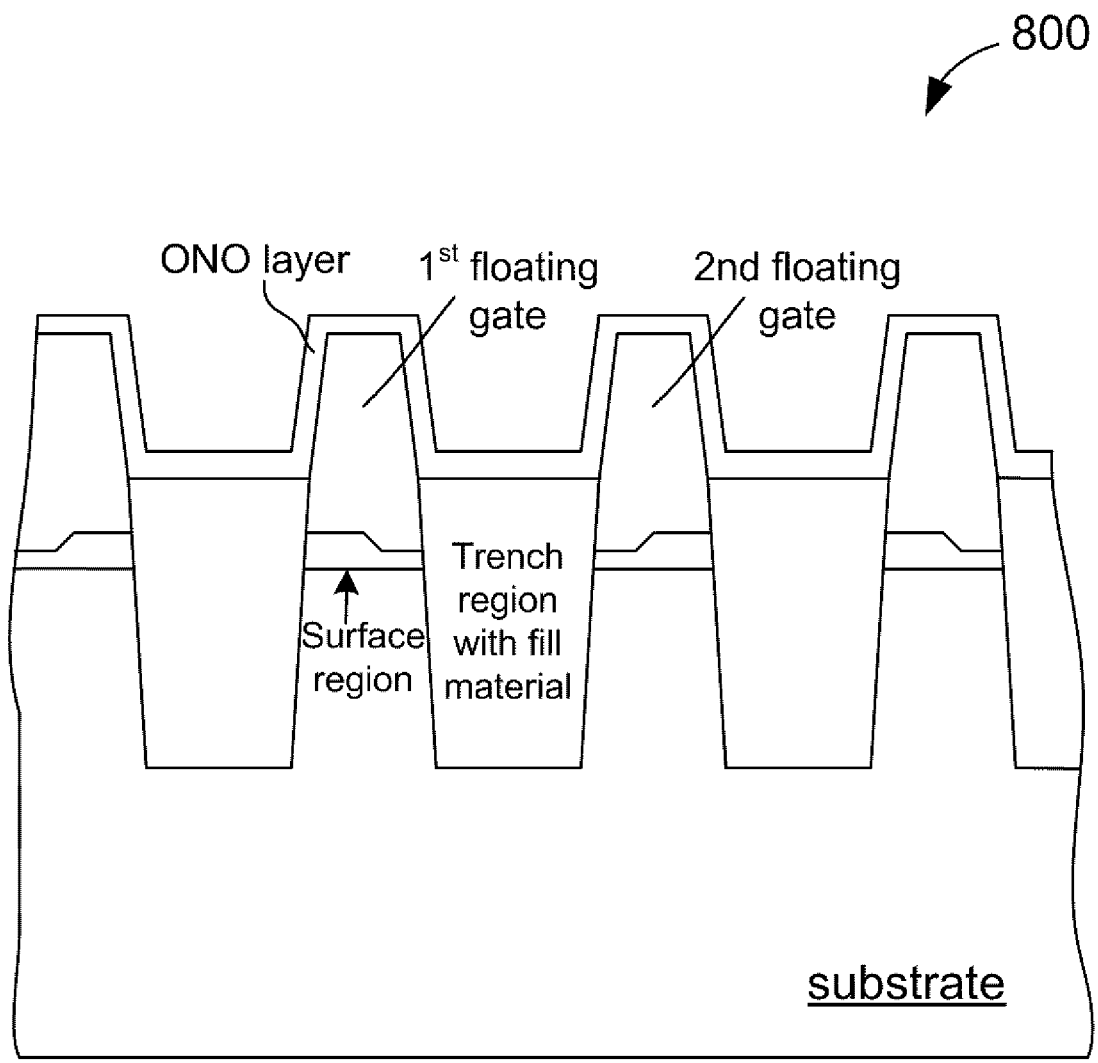
FIG. 8 is an illustration of a Flash memory device structure according to an embodiment of the present invention.
Figure 8A:
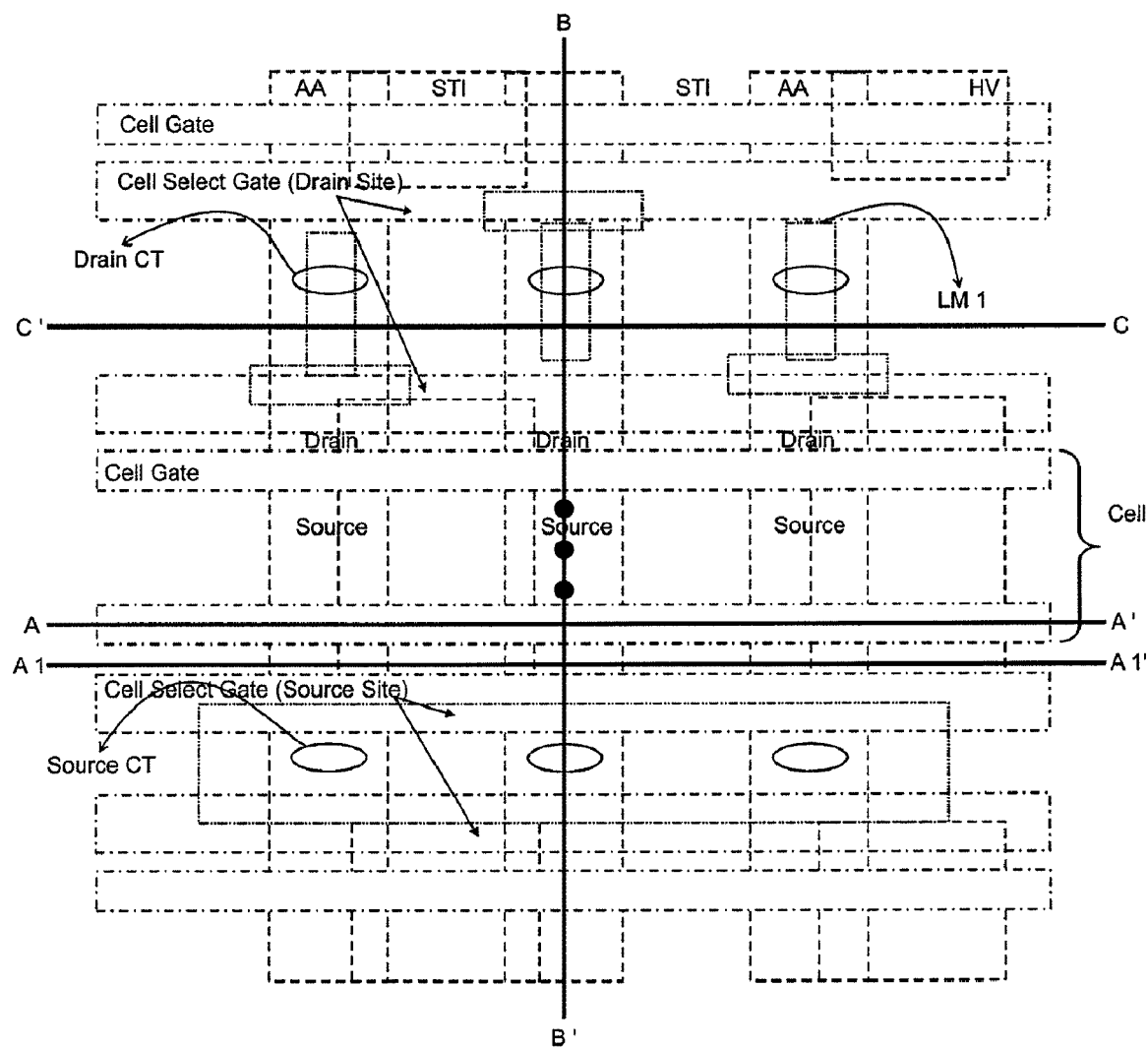

FIG. 8 is an illustration of a Flash memory device structure 800 according to an embodiment of the present invention. This diagram is merely an example, which should not unduly limit the scope of the claims herein. One of ordinary skill in the art would recognize many variations, modifications, and alternatives. As shown, a flash memory device structure 800 is provided. The structure has a semiconductor substrate including a surface region. In a specific embodiment, the semiconductor substrate can be a silicon wafer, an epitaxial wafer, a silicon on insulator wafer, or others. The structure has a gate dielectric layer (e.g., silicon dioxide, silicon oxynitride, silicon nitride) overlying the surface region. As shown, a portion of the gate dielectric is much thicker than other portions. The structure has a floating gate layer having a floating gate layer thickness and including a first floating gate structure overlying a first portion of the gate dielectric layer and a second floating gate structure overlying a second portion of the gate dielectric layer.

In a preferred embodiment, the first floating gate structure is separated and distinct from the second floating gate structure. The structure has a trench region provided between the first floating gate structure and the second floating gate structure and extending through an entirety of the floating gate layer thickness, which separates the two floating gate structures from each other. The trench region extends through a portion of the surface region into a depth of the semiconductor substrate. The structure also has a dielectric material (e.g., a high density plasma oxide) filling an entirety of the depth of the trench region in the semiconductor substrate and filling a portion of the trench region between the first floating gate structure and the second floating gate structure. The structure has an oxide on nitride on oxide layer overlying the first floating gate structure, the dielectric material, and the second floating gate structure. The flash memory device structure also has a control gate overlying the oxide on nitride on oxide layer. Further details of forming the trench structure, which enlarges the ONO layer region, can be found throughout the present specification and more particularly below.

Figure 8B:
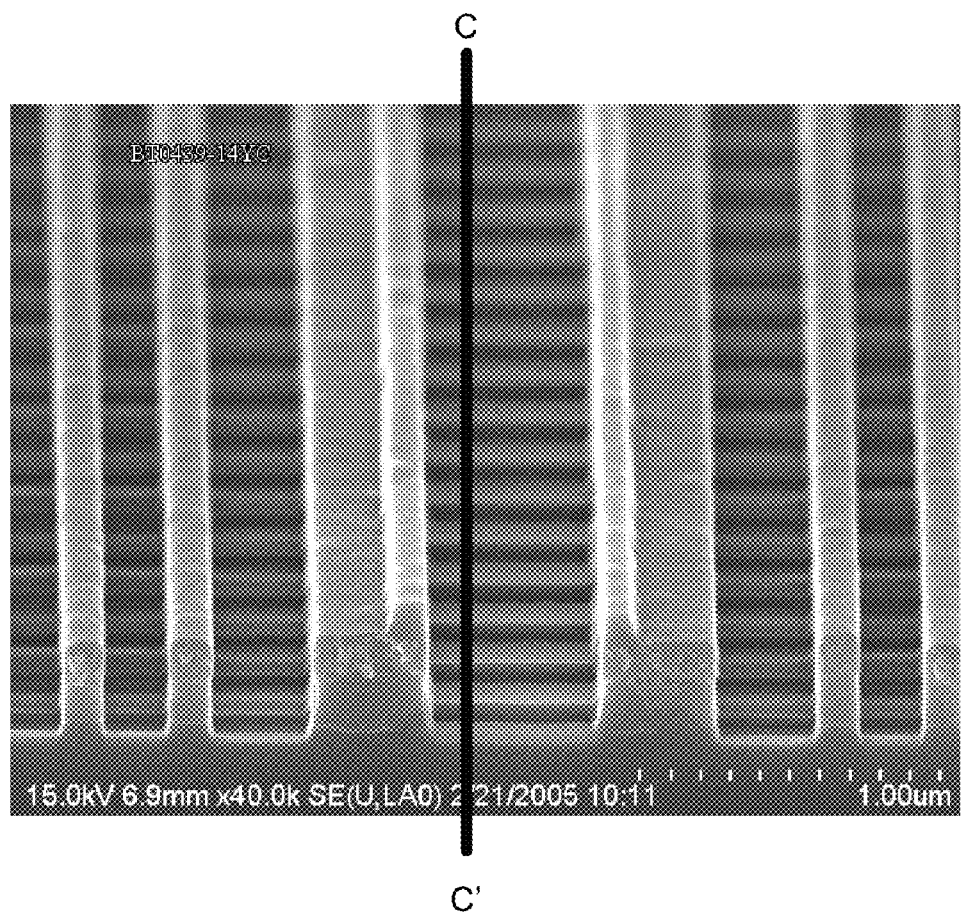
Figure 8B:
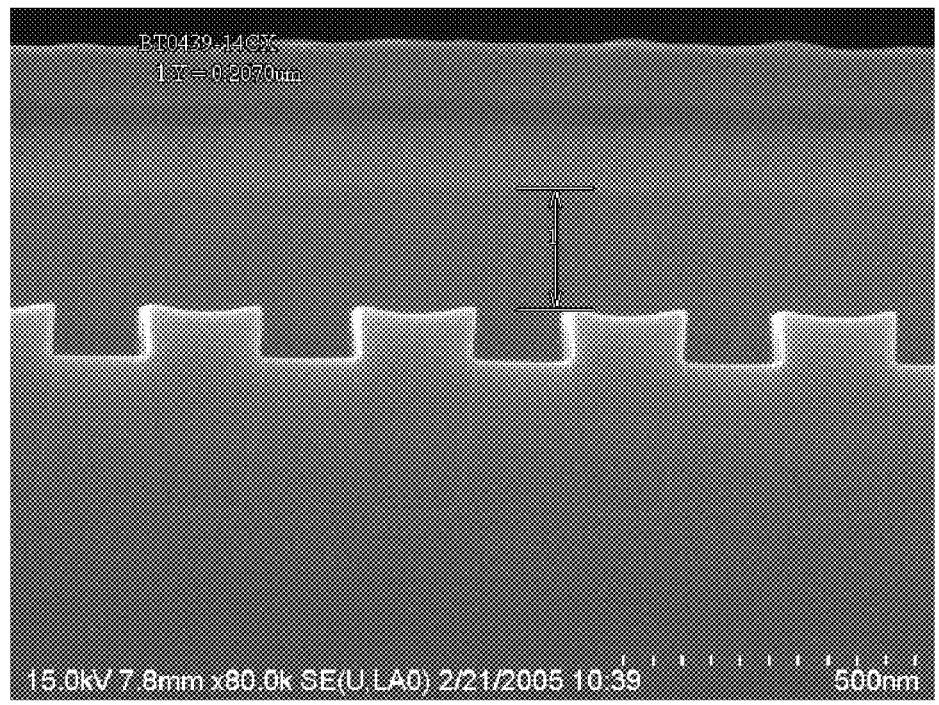
Figure 8C:
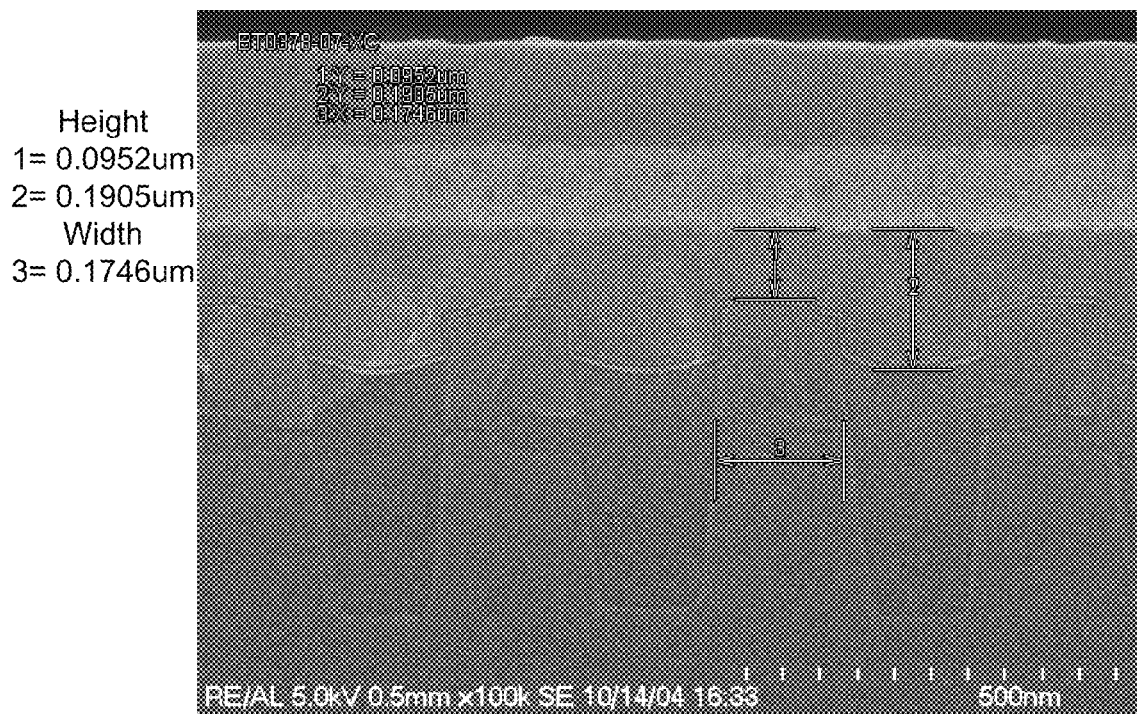
Figure 8C:
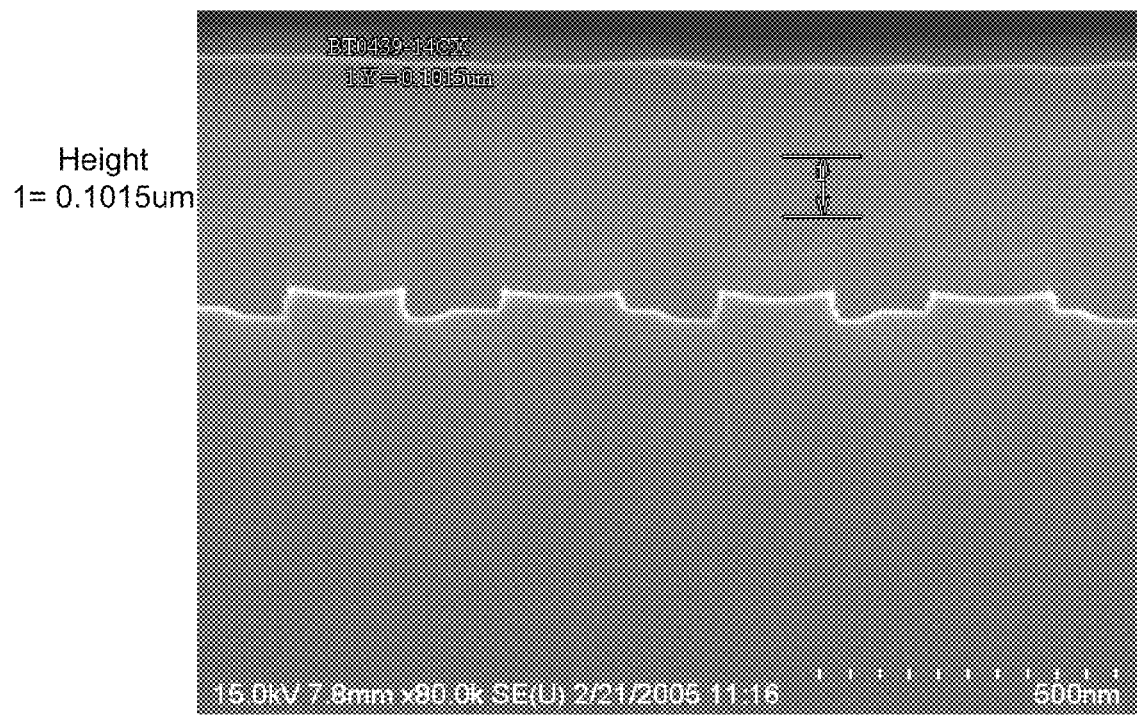

FIGS. 8A, 8B, 8C, and 8D are simplified top-view and cross-sectional view diagrams of a Flash memory device according to an embodiment of the present invention. These diagrams are merely examples, which should not unduly limit the scope of the claims herein. One of ordinary skill in the art would recognize many variations, modifications, and alternatives. As shown, the top-view includes cell gate, cell select gate, corresponding source/drain regions, among other elements. As also shown are active areas labeled "AA" and isolation areas labeled "STI" which refers to shallow trench isolation according to a specific embodiment. Certain reference lines have also been shown. The lines include C'-C, which is illustrated in FIG. 8B. Lines A1-A1' and A-A' are illustrated in FIG. 8C. Line B-B' is illustrated in FIG. 8D. FIG. 8E shows an enlarged view of a portion of FIG. 8E.

Figure 8F:
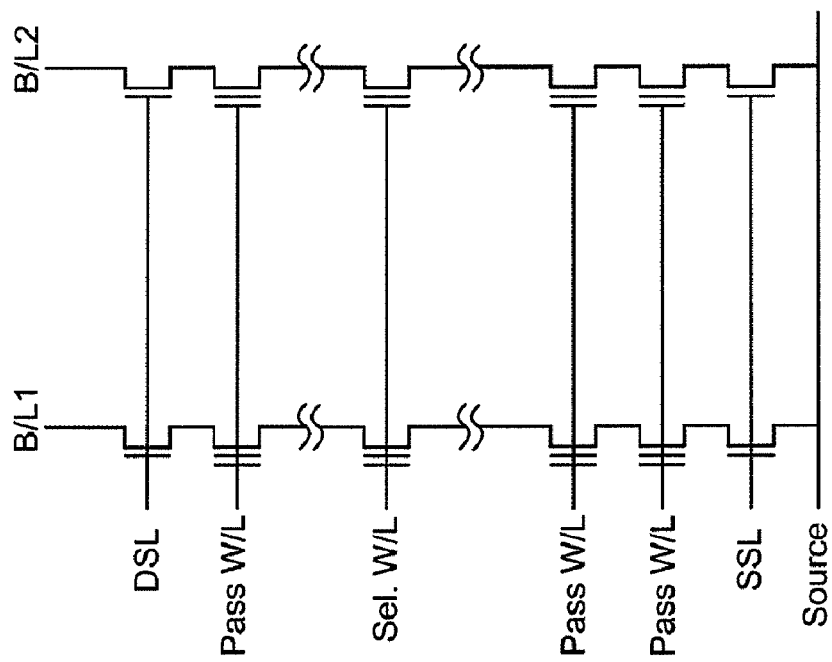
FIG. 8F is a simplified circuit diagram of a Flash memory device according to an embodiment of the present invention.

FIG. 8F is a simplified circuit diagram of a Flash memory device according to an embodiment of the present invention. This diagram is merely an example, which should not unduly limit the scope of the claims herein. One of ordinary skill in the art would recognize many variations, modifications, and alternatives. As shown, the circuit diagram on the left hand side includes lines B/L1 and B/L2. Lines B/L1 and B/L2 are coupled to signal lines DSL, pass W/L, select W/L, a pair of pass W/Ls, SSL, and source. Shown in the right hand side of FIG. 8F is a table, which lists functions of provides voltage settings for signal lines, source, and Pwell for the "Erase," "Program," and "Read" operations according to an exemplary embodiment. The values are given in unit of volts, and "F" denotes "floating", i.e., the signal lines may not be connected to a voltage source or ground for the associated "Erase" operation. Of course, there can be other variations, modifications, and alternatives.

Figure 8G:
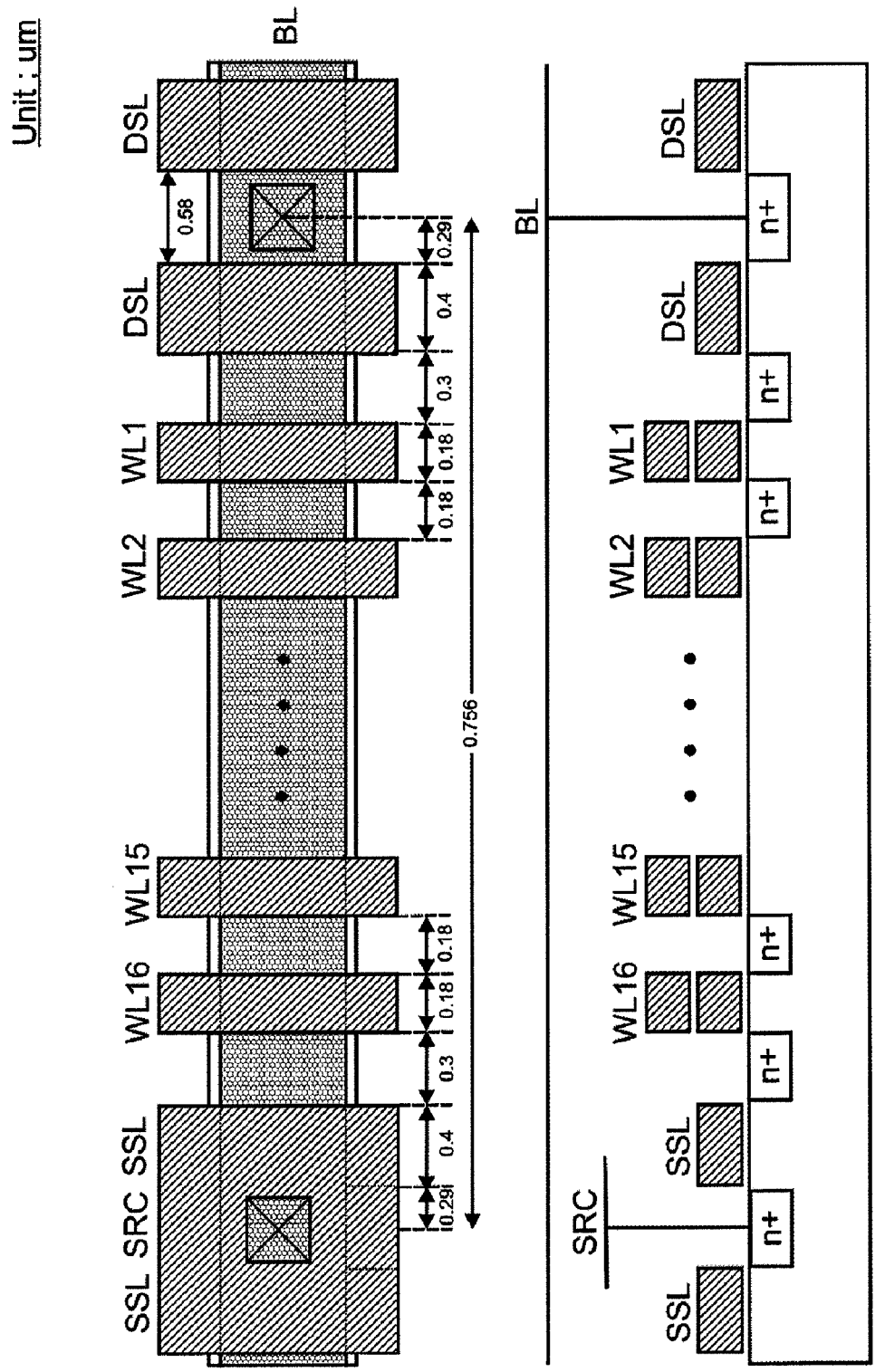
FIG. 8G is a simplified top-view and side-view diagrams of a Flash memory device according to an embodiment of the present invention.

FIG. 8G is a simplified top-view and side-view diagrams of a Flash memory device according to an embodiment of the present invention. This diagram is merely an example, which should not unduly limit the scope of the claims herein. One of ordinary skill in the art would recognize many variations, modifications, and alternatives. In the example shown, the elements within FIG. 8G are not necessarily to scale, emphasis instead is placed on clearly illustrating the memory cells relative to one another. Further details of the Flash memory device can be found throughout the present specification and more particularly below.

Figure 9:
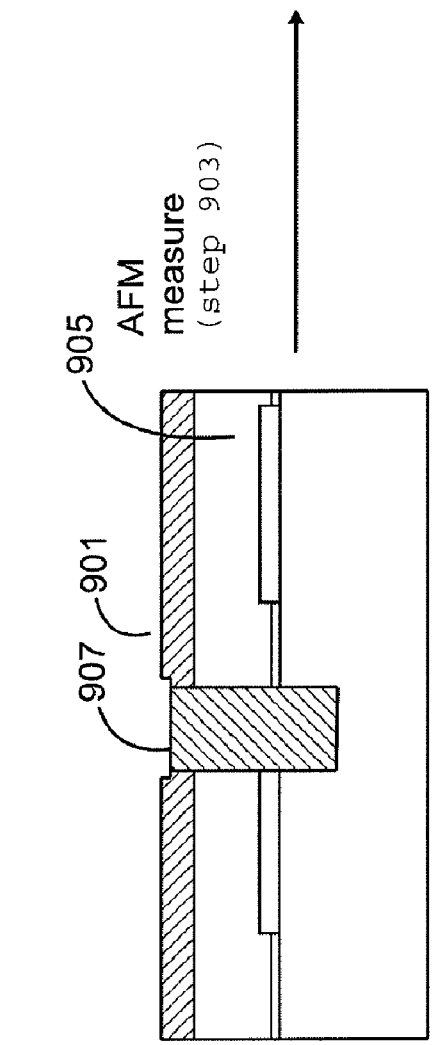

FIGS. 9 through 12 are simplified diagrams illustrating a method for fabricating a Flash memory device according to an embodiment of the present invention. These diagrams are merely examples, which should not unduly limit the scope of the claims herein. One of ordinary skill in the art would recognize many variations, modifications, and alternatives. As shown in FIG. 9, the structure has been subjected to a planarization process, which forms a surface region including hard mask 901, floating gate layer 905, and fill material 907. Of course, there can be other variations, modifications, and alternatives.

Figure 10:
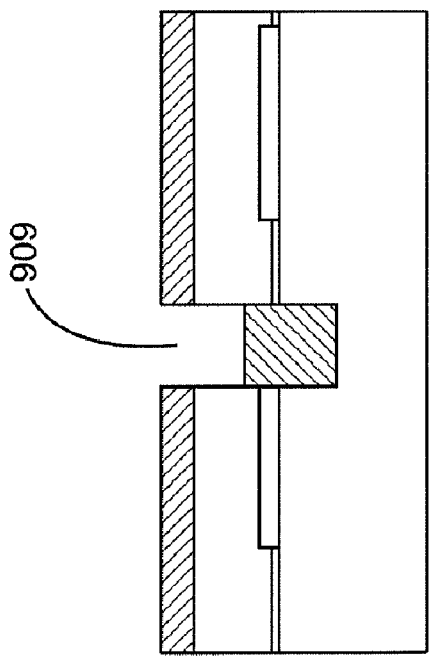
FIGS. 9 through 12 are simplified diagrams of a method for fabricating a Flash memory device according to an embodiment of the present invention.
Figure 13:
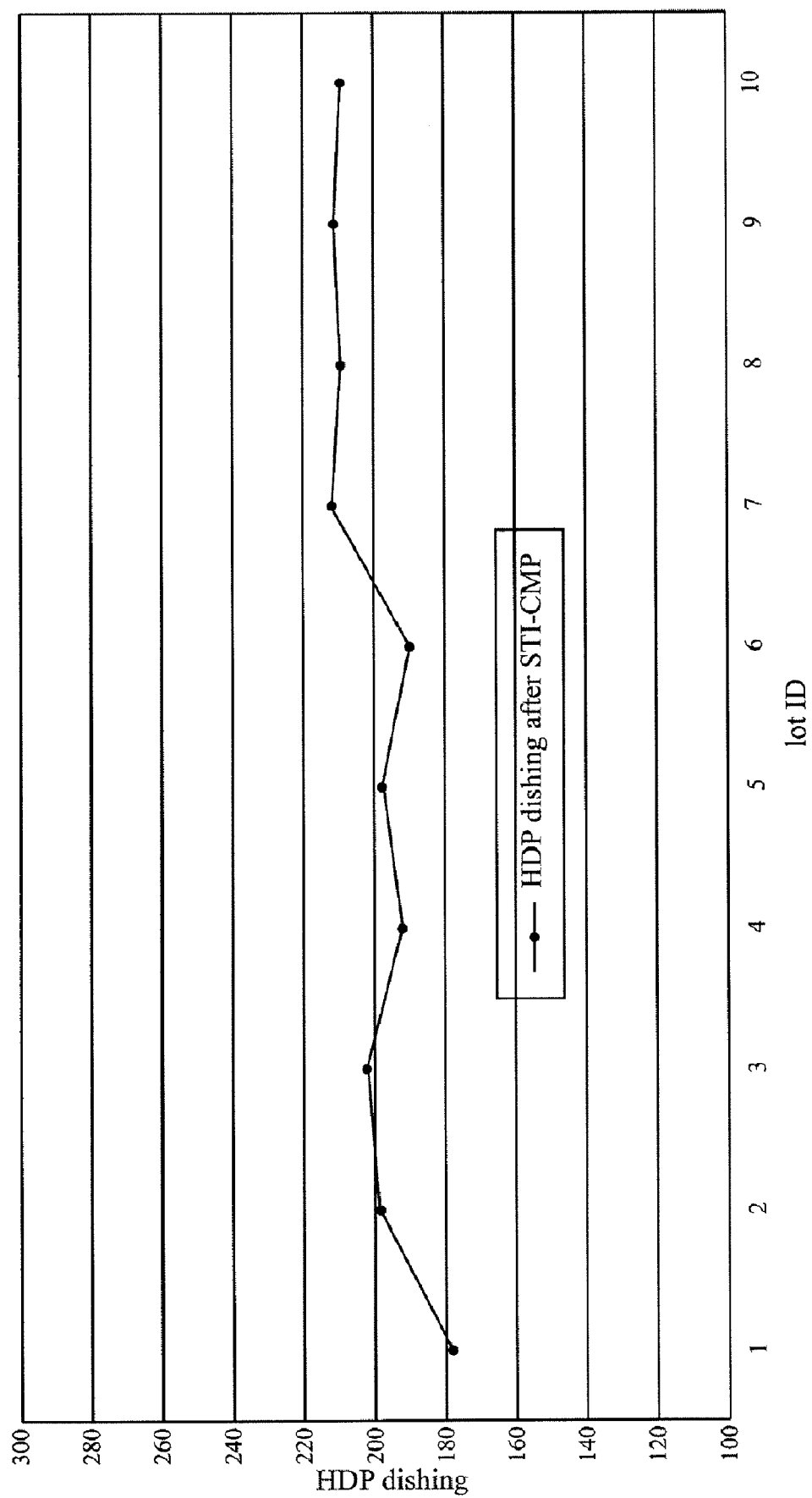
FIGS. 13 and 14 are AFM plots of a flash memory cell according to an embodiment of the present invention.

In a specific embodiment, the method subjects a resulting structure of FIG. 9 to a measurement process (step 903). That is, the method performs the measurement process using an atomic force microscope (AFM), which determines a height profile of the fill material. An example of an atomic force microscope process after chemical mechanical planarization is illustrated in FIG. 13. Once the height profile has been determined, the method performs an etching process to selectively remove a thickness of the fill material, as illustrated in FIG. 10. As shown, a thickness 909 of the fill material has been removed according to a specific embodiment. Depending upon the embodiment, the selective removal occurs using a wet and/or dry etching process. An example of the selective removal uses a hydrofluoric acid species to selectively remove the thickness of the fill material to expose edges of the floating gate structure, while maintaining the fill material at a predetermined thickness of the floating gate layer according to a specific embodiment.

Figure 11:
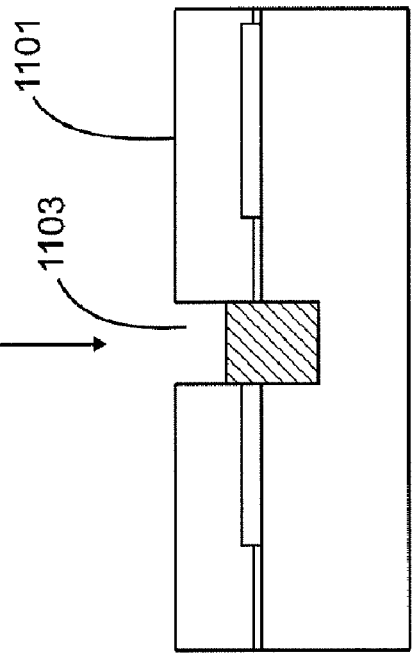

Referring to FIG. 11, the method selectively removes the hard mask layer to expose the floating gate layer 1101. In a preferred embodiment, the selective removal occurs without substantially changing the thickness 1103 of the fill material, as shown. As merely an example, a hard mask made of silicon nitride is selectively removed using a wet or dry process. An example of a selective removal process uses a phosphoric acid species, which selectively removes the silicon nitride without damaging the fill material, which is an oxide material and/or the floating gate layer, which is made of polysilicon and/or other suitable materials. Of course, there can be other variations, modifications, and alternatives.

Figure 14:
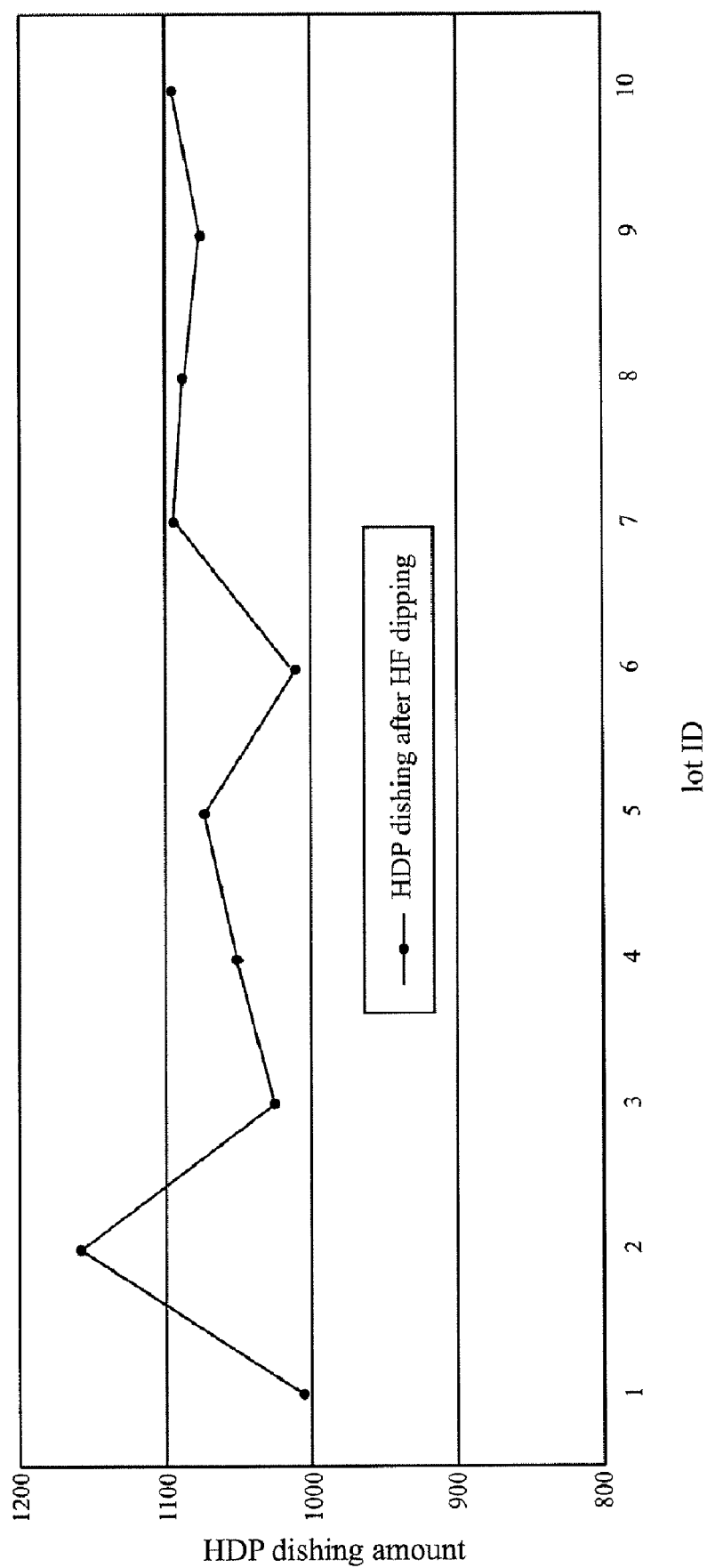

In a specific embodiment, the method performs a measurement process to determine a height profile of the fill material and/or exposed thickness of the floating gate layer after a portion of the filled material is removed. That is, the method performs the measurement process using an atomic force microscope, which determines the height profile of the fill material and/or exposed thickness of the floating gate layer, step 1105. Depending upon the embodiment, if the thickness of the exposed floating gate structure meets a predetermined specification window, the method performs other processes. An example of an atomic force microscope process after chemical mechanical planarization and selective etching is illustrated in FIG. 14.

Figure 12:
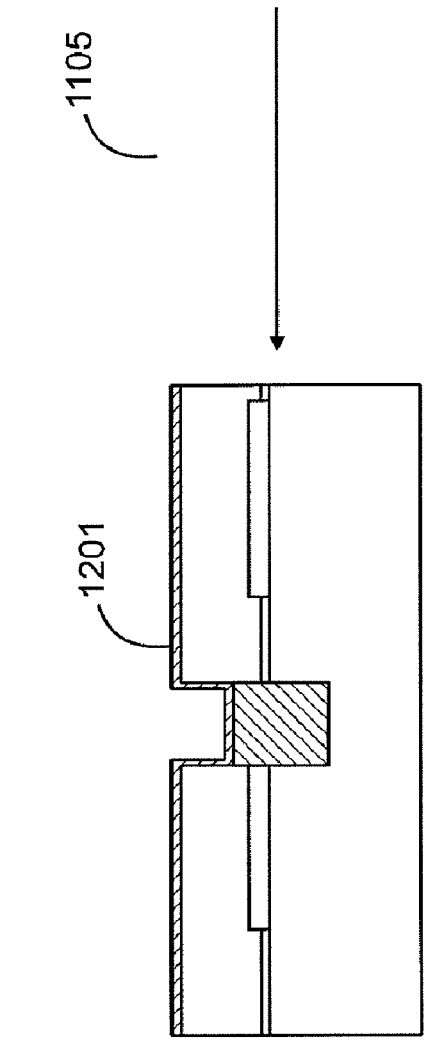

Referring to FIG. 12, the method forms dielectric materials 1201 overlying a resulting structure, including the patterned floating gate layer, exposed portion of the fill material, and exposed portion of the floating gate layer. In a preferred embodiment, the dielectric materials include an oxide on nitride on oxide structure. That is, the oxide on nitride on oxide structure is often called an ONO layer or other like layer and/or layers. To complete the flash memory device, the method forms a control gate layer overlying the ONO layer. The device also includes metallization and passivation layers according to a specific embodiment. Of course, there can be other variations, modifications, and alternatives.

Figure 12A:
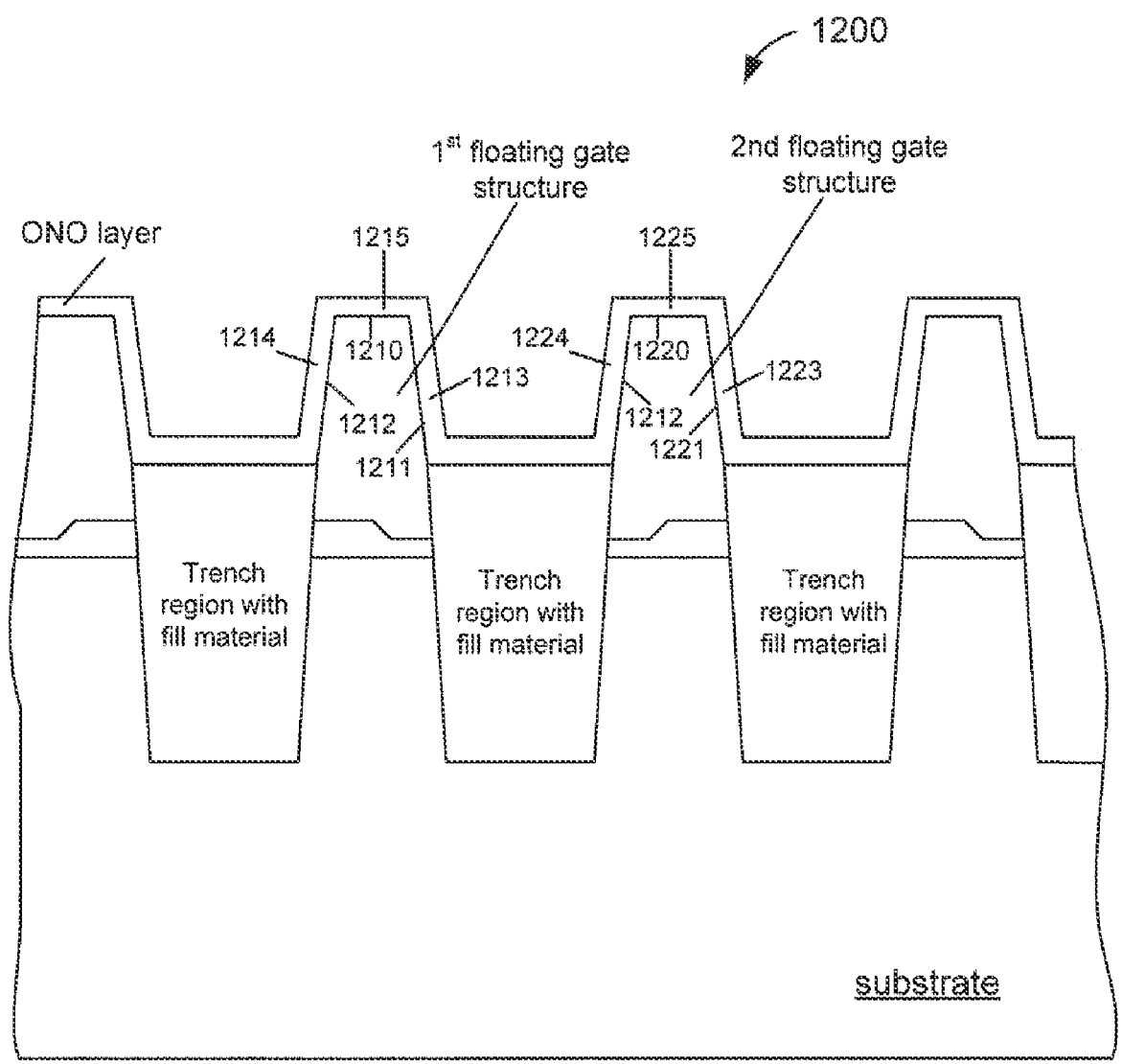
FIG. 12A is an illustration of an exemplary Flash memory device according to an embodiment of the present invention.

As shown in FIG. 12, the oxide dip height, measured from the upper surface of the removed portion of the fill material to the patterned floating gate layer, affects the gate coupling ratio. The gate coupling ratio is proportional to the ratio of the surface area of the floating gate structure and the ONO layer. A high gate coupling ratio enables a low write voltage to the floating gate structure. FIG. 12A is an illustration of an exemplary Flash memory device 1200 according to an embodiment of the present invention. The first floating gate structure includes a first upper surface region 1210, a first edge 1211, and a second edge 1212. The first edge is in contact with a first portion 1213 of the ONO layer, and the second edge is in contact with a second portion 1214 of the ONO layer. The first upper surface region of the first floating gate structure is in contact with a third portion 1215 of the ONO layer, whereupon the first and second portions of the ONO layer have a total surface area that is at least equal to the third portion surface area of the ONO layer.

In another embodiment, the second floating gate structure includes a second upper surface region 1220, a third edge 1221, and a fourth edge 1222. The third edge is in contact with a fourth portion 1223 of the ONO layer, and the fifth edge is in contact with a fourth portion 1224 of the ONO layer. The second upper surface region of the second floating gate structure is in contact with a sixth portion 1225 of the ONO layer, whereupon the fourth and fifth portions of the ONO layer have a total surface area that is at least equal to the surface area of the sixth portion of the ONO layer.

The above sequence of steps is a method according to an embodiment of the present invention. As shown, the method provides a method for forming a flash memory device structure using a method for forming an improved ONO structure between the floating gate and control gate of a flash memory device according to a specific embodiment of the present invention. Other alternatives can also be provided where steps are added, one or more steps are removed, or one or more steps are provided in a different sequence without departing from the scope of the claims herein.

It is also understood that the examples and embodiments described herein are for illustrative purposes only and that various modifications or changes in light thereof will be suggested to persons skilled in the art and are to be included within the spirit and purview of this application and scope of the appended claims.

Experiment:

To prove the operation of the present method, we performed various experiments. These experiments are merely examples, which should not unduly limit the scope of the claims herein. One of ordinary skill in the art would recognize many variations, modifications, and alternatives. These experiments have been illustrated in the diagrams of FIGS. 15 through 20. As shown, the present experiment performs certain aspects of the method described herein.

In a specific example, the method has been provided to increase a coupling ratio of a flash memory device. As merely an example to increase the coupling ratio, a wet-dip process is added after shallow trench isolation (STI) CMP. The wet dip process caused a portion of the floating gate layer to be exposed. We discovered that as the wet-dip time was increased, causing more of the floating gate layer to be exposed, the coupling ratio increased accordingly.

Figure 15:
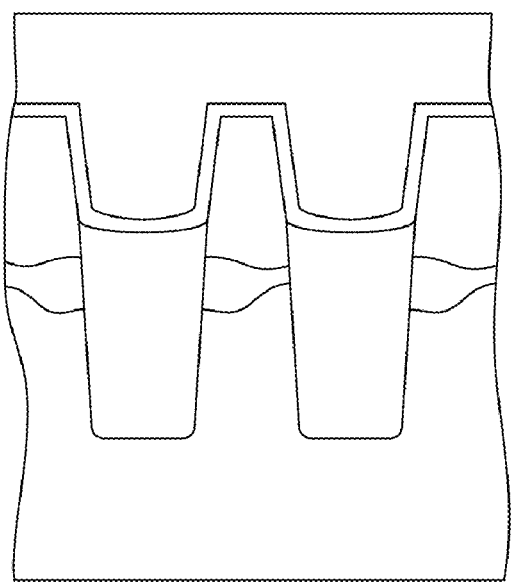
FIGS. 15 through 20 are experimental results of a method according to embodiments of the present invention.
Figure 16:
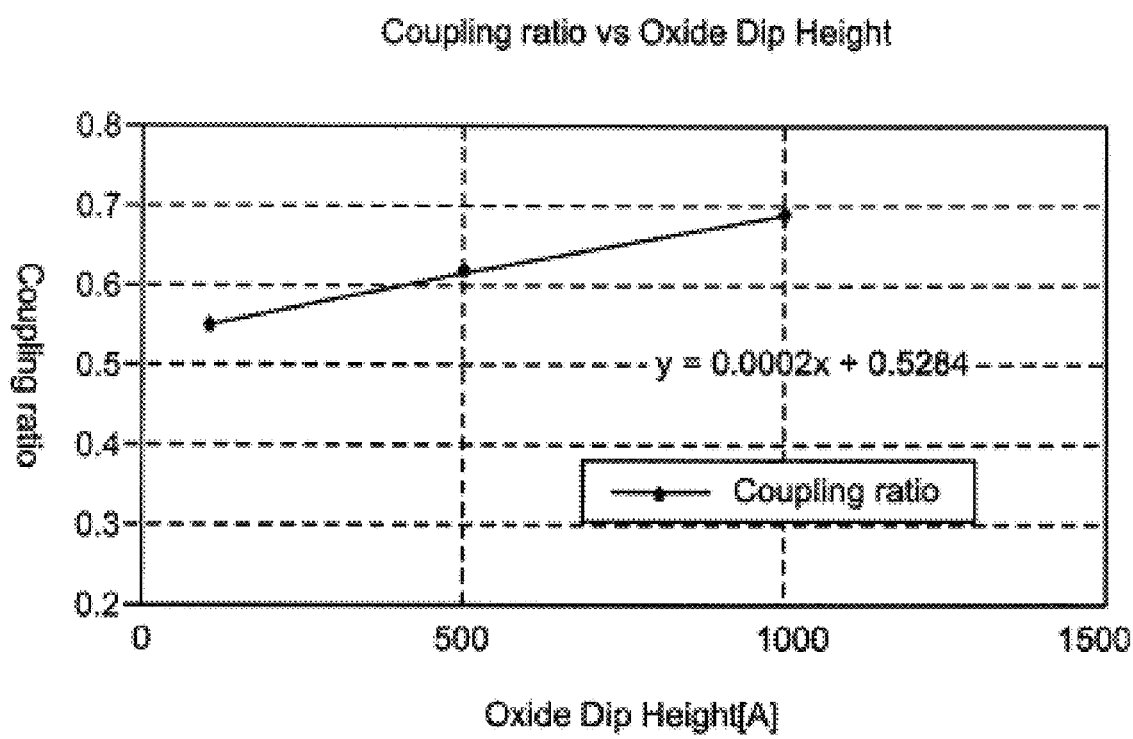
Figure 17:
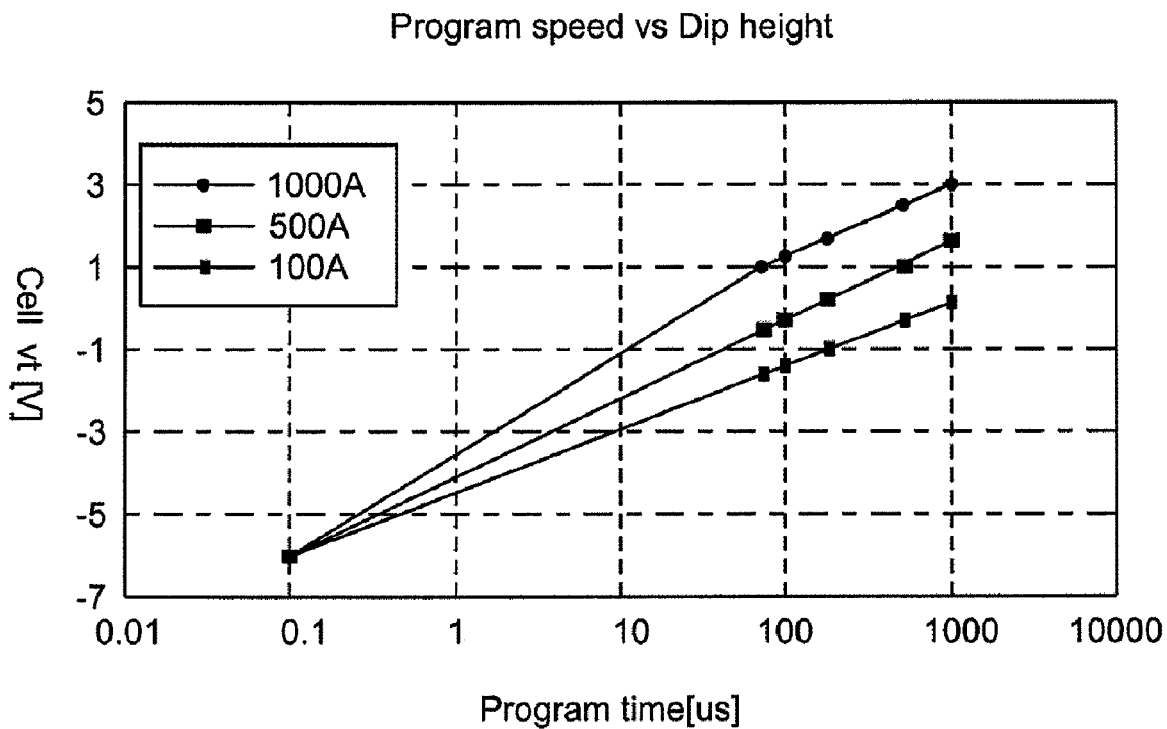
Figure 18:
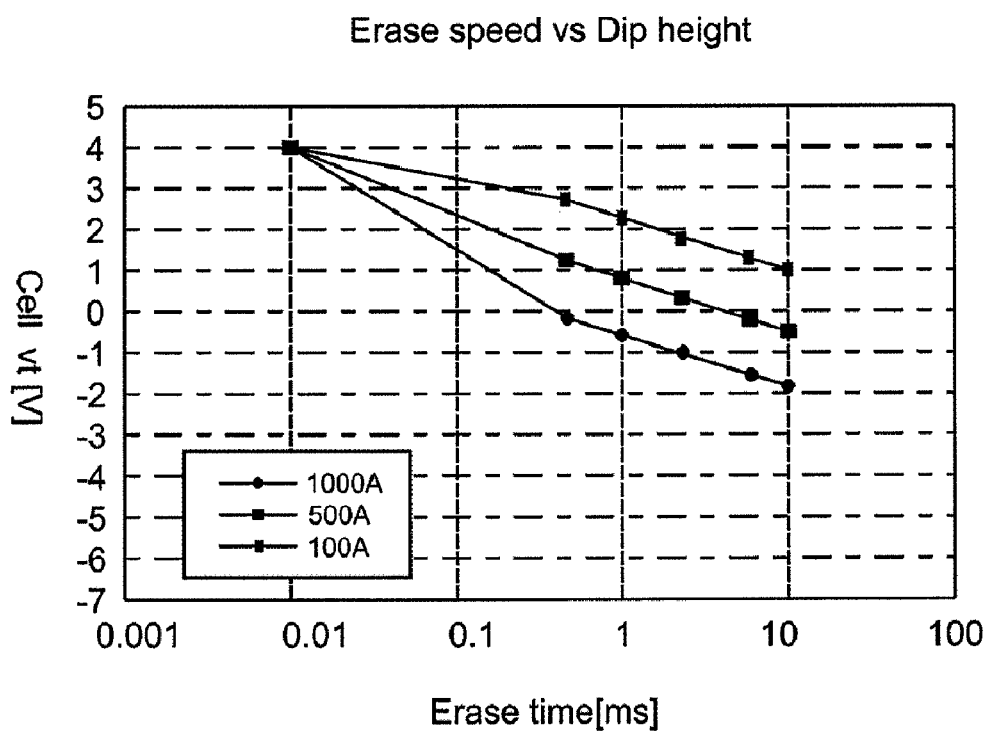
Figure 19:
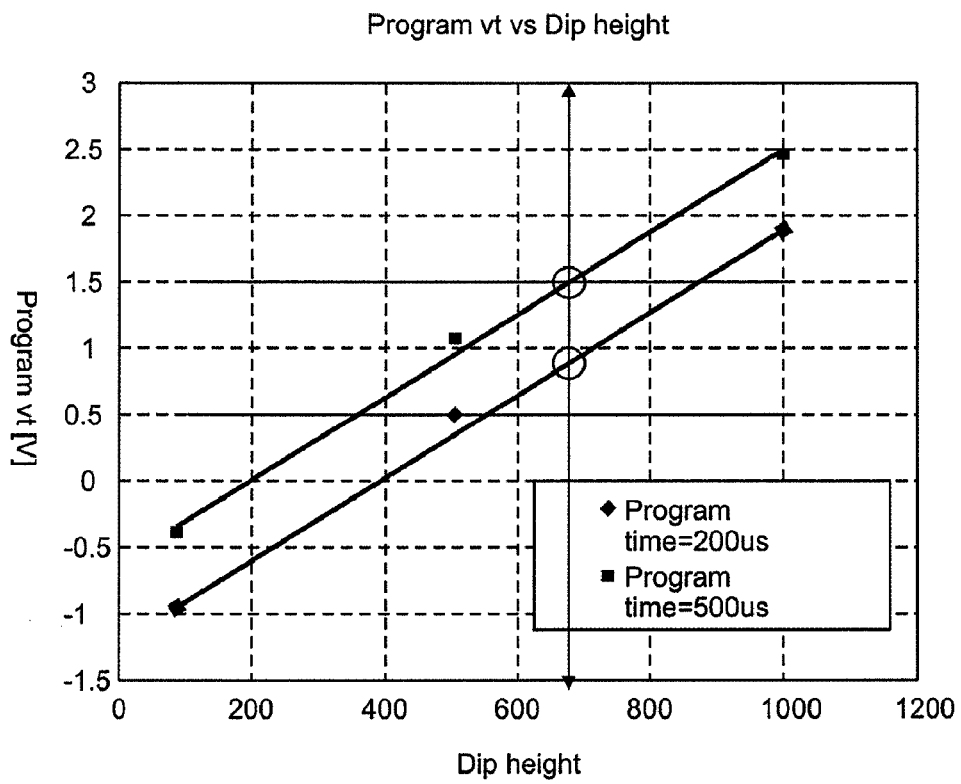
Figure 20:
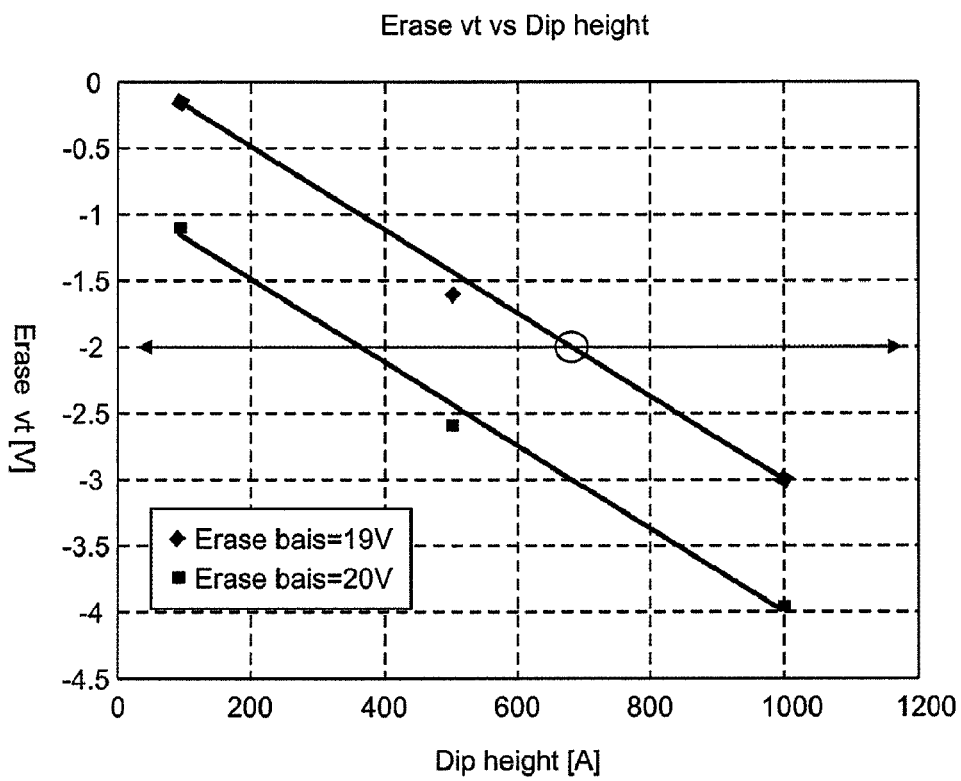

We further noted that certain gate polysilicon (GP) etch and self-aligned etch (SAE) was often difficult (FIG. 15). FIG. 16 illustrated the gate coupling ratio as a function of the oxide dip height. As shown, the gate coupling ratio is proportional to the oxide dip height. FIGS. 17 and 18 showed the respective program and erase speed characteristics. As shown, the cell threshold voltage (Vt) target after programming 200 us is between 0.5V and 1.5V. FIGS. 19 and 20 illustrated the program and erase characteristics, respectively, with the additional wet dip step and resulting structures. When a dip height (recess of a peripheral HDP oxide measured from an upper surface of floating gate polysilicon layer) was less than 700 Angstroms, a typical program target of 1 volt could not be met. Also, when the dip height was less than 700 Angstroms, a cell Vt of less than −2V can be obtained at 19 volts for 1 millisecond erase time. Because erase Vt was shifted by 2 volts after 100 thousand cycling, erase Vt was less than −3V at 20V for 1 ms erasing. Accordingly, we have found it was desirable to conduct the present AFM measurement process to determine the dip height while carrying out the present method according to a specific embodiment. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A flash memory device comprising:
   a semiconductor substrate including a surface region;
   a gate dielectric layer overlying the surface region;
   a floating gate layer having a floating gate layer thickness and including a first floating gate structure overlying a first portion of the gate dielectric layer and a second floating gate structure overlying a second portion of the gate dielectric layer;
   a trench region provided between the first floating gate structure and the second floating gate structure and extending through an entirety of the floating gate layer thickness, the trench region extending through a portion of the surface region into a depth of the semiconductor substrate;
   a dielectric material filling an entirety of the depth of the trench region in the semiconductor substrate and filling a portion of the trench region between the first floating gate structure and the second floating gate structure;
   an oxide on nitride on oxide layer overlying the first floating gate structure, the dielectric material, and the second floating gate structure; and
   a control gate overlying the oxide on nitride on oxide layer;
   wherein the gate dielectric layer comprises a first thickness and a second thickness.

2. The flash memory device of claim 1, wherein the first thickness is about 80 to 100 Angstroms and the second thickness is about 300 Angstroms to about 600 Angstroms.

3. The flash memory device of claim 1, wherein the first thickness is associated with a low voltage region, the low voltage region corresponding to about 1 volt to 3 volts, wherein the second thickness is associated with a high voltage region, the high voltage region corresponding to about 12 volts to about 20 volts.

4. The flash memory device claim 1, wherein the filled portion of the trench region between the first and second floating gate structures is greater than about 100 Angstroms.

5. The flash memory device of claim 1, wherein the depth of the semiconductor substrate is greater than about 2000 Angstroms.

6. The flash memory device of claim 1, wherein the first floating gate structure comprises:
   a first upper surface region, a first edge and a second edge, the first edge being in contact with a first portion of the oxide on nitride on oxide layer, the second edge being in contact with a second portion of the oxide on nitride on oxide layer, the first upper surface region being in contact with a third portion of the oxide on nitride on oxide layer;
   whereupon the first portion and the second portion of the oxide on nitride on oxide layer have a total surface area that is at least equal to a surface area of the third portion of the oxide on nitride on oxide layer; and
   wherein the second floating gate structure comprises:
   a second upper surface region, a third edge and a fourth edge, the third edge being in contact with a fourth portion of the oxide on nitride on oxide layer, the fourth edge being in contact with a fifth portion of the oxide on nitride on oxide layer, the second upper surface region being in contact with a sixth portion of the oxide on nitride on oxide layer;
   whereupon the fourth portion and the fifth portion of the oxide on nitride on oxide layer have a total surface area that is at least equal to a surface area of the sixth portion of the oxide on nitride on oxide layer.

7. The flash memory device of claim 1, wherein each of the first and second floating gate structures is associated with at least one Flash memory cell.

8. The flash memory device of claim 1, wherein the dielectric fill material comprises a high density plasma (HDP) oxide bearing material.

9. The flash memory device of claim 1 further comprising:
   a first source region and a first drain region within a vicinity of the first floating gate structure; and
   a second source region and a second drain region within a vicinity of the second floating gate structure.

\* \* \* \* \*